United States Patent
Kim et al.

(10) Patent No.: US 9,766,544 B2
(45) Date of Patent: Sep. 19, 2017

(54) COMPOSITION FOR FORMING TOPCOAT LAYER AND RESIST PATTERN FORMATION METHOD EMPLOYING THE SAME

(71) Applicant: SAMSUNG ELECTRONICS CO., LTD., Suwon-si, Gyeonggi-do (KR)

(72) Inventors: Hyun-woo Kim, Seongnam-si (KR); Cheol hong Park, Seoul (KR); Tetsuo Okayasu, Kakegawa (JP); Xiaowei Wang, Kakegawa (JP); Georg Pawlowski, Kakegawa (JP); Yusuke Hama, Kakegawa (JP)

(73) Assignees: Samsung Electronics Co., LTD., Suwon-Si, Gyeonggi-do (KR); AZ Electronics Materials (Luxembourg) S.A.R.L., Luxembourg (LU)

( * ) Notice: Subject to any disclaimer, the term of this patent is extended or adjusted under 35 U.S.C. 154(b) by 0 days.

(21) Appl. No.: 14/549,911

(22) Filed: Nov. 21, 2014

(65) Prior Publication Data

US 2015/0147701 A1 May 28, 2015

(30) Foreign Application Priority Data

Nov. 22, 2013 (JP) ................................ 2013-242092
Apr. 8, 2014 (KR) ........................ 10-2014-0042023

(51) Int. Cl.
*G03F 7/09* (2006.01)
*G03F 7/20* (2006.01)
*C09D 5/00* (2006.01)
*C09D 7/12* (2006.01)
*G03F 7/11* (2006.01)

(52) U.S. Cl.
CPC ............ *G03F 7/2004* (2013.01); *C09D 5/00* (2013.01); *C09D 7/1225* (2013.01); *G03F 7/091* (2013.01); *G03F 7/11* (2013.01)

(58) Field of Classification Search
CPC . G03F 7/09; G03F 7/11; G03F 7/2004; G03F 7/091; C09D 5/00
See application file for complete search history.

(56) References Cited

U.S. PATENT DOCUMENTS

| | | | |
|---|---|---|---|
| 4,740,451 A | 4/1988 | Kohara | |
| 7,316,886 B2 | 1/2008 | Kanda | |
| 7,335,455 B2 | 2/2008 | Kim et al. | |
| 7,361,447 B2 | 4/2008 | Jung | |
| 7,537,880 B2 | 5/2009 | Harada et al. | |
| 7,678,462 B2 | 3/2010 | Kennedy et al. | |
| 8,101,015 B2 | 1/2012 | Kennedy et al. | |
| 8,211,618 B2 | 7/2012 | Hatakeyama et al. | |
| 8,344,088 B2 | 1/2013 | Kennedy et al. | |
| 8,715,911 B2 | 5/2014 | Kim et al. | |
| 8,927,658 B2 * | 1/2015 | Imae et al. | 525/435 |
| 2004/0018451 A1 | 1/2004 | Choi | |
| 2004/0142275 A1 * | 7/2004 | Komatsu | G03F 7/0233 430/270.1 |
| 2005/0008864 A1 | 1/2005 | Ingen Schenau et al. | |
| 2007/0122741 A1 | 5/2007 | Hatakeyama et al. | |
| 2010/0247892 A1 * | 9/2010 | Lee et al. | 428/221 |
| 2010/0317790 A1 * | 12/2010 | Jang | B82Y 30/00 524/496 |
| 2011/0133607 A1 * | 6/2011 | Lee et al. | 310/365 |
| 2011/0143101 A1 * | 6/2011 | Sandhu | 428/195.1 |
| 2011/0268647 A1 * | 11/2011 | Ivanovici | B01J 21/08 423/448 |
| 2012/0021355 A1 | 1/2012 | Kim et al. | |
| 2012/0021555 A1 | 1/2012 | Tu et al. | |
| 2012/0070689 A1 | 3/2012 | Kennedy et al. | |
| 2012/0164433 A1 * | 6/2012 | Advincula | 428/327 |
| 2013/0075326 A1 * | 3/2013 | Yun et al. | 210/505 |
| 2013/0164677 A1 | 6/2013 | Kennedy et al. | |
| 2013/0209940 A1 | 8/2013 | Sakamoto et al. | |
| 2014/0001417 A1 * | 1/2014 | Kim et al. | 252/511 |
| 2014/0212818 A1 * | 7/2014 | Kang et al. | 430/325 |
| 2014/0227538 A1 | 8/2014 | Baldwin et al. | |

FOREIGN PATENT DOCUMENTS

| | | |
|---|---|---|
| JP | 09-246173 A | 9/1997 |
| JP | 2004-0348133 A | 12/2004 |
| JP | 2005-0352384 A | 12/2005 |
| JP | 2006-178317 A | 7/2006 |
| JP | 2007-316581 A | 12/2007 |
| JP | 2008-0065304 A | 3/2008 |
| JP | 2008-0111103 A | 5/2008 |
| JP | 2010-0237661 A | 10/2010 |
| KR | 100053959 B1 | 8/1992 |
| KR | 10-2004-0009384 A | 1/2004 |
| KR | 10-2005-0000180 A | 1/2005 |
| KR | 10-2005-0031257 A | 4/2005 |
| KR | 10-2005-0044501 A | 5/2005 |
| KR | 10-2008-0014388 A | 2/2008 |
| KR | 10-2008-0089265 A | 10/2008 |
| WO | WO 2012/053302 A1 | 4/2012 |
| WO | WO 2012/124935 * | 9/2012 |

OTHER PUBLICATIONS

CD Uniformity Improvement for EUV Resists Process: EUV Resolution Enhancement Layer; Proc. of SPIE, vol. 7969 7969-1; Kim, et al.

* cited by examiner

*Primary Examiner* — Anca Eoff
(74) *Attorney, Agent, or Firm* — Lee & Morse, P.C.

(57) ABSTRACT

Provided is a composition for forming a topcoat layer, the composition including a graphene derivative including a hydrophilic group; and a solvent. Also provided is a pattern formation method, including disposing a resist composition on a substrate, to form a resist layer; coating the resist layer with a composition including a graphene derivative including a hydrophilic group, and a solvent; heating the composition to harden the composition; subjecting the resist layer to exposure using extreme ultraviolet light; and developing exposed resist layer with an alkali aqueous solution.

10 Claims, No Drawings

COMPOSITION FOR FORMING TOPCOAT LAYER AND RESIST PATTERN FORMATION METHOD EMPLOYING THE SAME

CROSS-REFERENCE TO RELATED APPLICATIONS

Japanese Patent Application No. 2013-242092, filed on Nov. 22, 2013, in the Japanese Patent Office, and Korean Patent Application No. 10-2014-0042023, filed on Apr. 8, 2014, in the Korean Intellectual Property Office, and entitled: "Composition for Forming Topcoat Layer and Resist Pattern Formation Method Employing the Same," are incorporated by reference herein in their entireties.

BACKGROUND

1. Field

Embodiments are directed to a composition for forming a topcoat layer, and to a resist pattern formation method employing the same.

2. Description of the Related Art

Size reduction of various devices may require high integration of semiconductor ICs (integrated circuits), and more minute resist patterns. To satisfy such requirements, it may be necessary to adopt a photo-lithographic process including exposure to light in a shorter wavelength range. The light for exposure may change from visible light to UV (ultraviolet) or far UV light. The exposure may be carried out using extreme UV light. For example, in the manufacture of semiconductor devices such as ICs and LSIs (large scale integrated circuits), for example, in production processes of DRAMs (dynamic random-access memories), flash memories and logic semi-conductor devices, formation of ultrafine patterns may be required, and lithography with extreme UV light may become more important.

SUMMARY

Embodiments may be realized by providing a composition for forming a topcoat layer, the composition including a graphene derivative including a hydrophilic group; and a solvent.

The hydrophilic group may be selected from a hydroxyl group, a carboxyl group, an amino group, an amido group, a nitro group, a cyano group, a polyalkyleneoxide group, and a sulfo group.

The graphene derivative may be obtained by oxidizing graphene.

The graphene derivative may be present in an amount of about 0.01 to about 10 wt % based on a total weight of the composition.

The composition may further include a binder.

The binder may include a deep-ultraviolet absorbing group.

The binder may be present in an amount about 0.01 to about 10 wt % based on a total weight of the composition.

An oxygen content of the graphene derivative may be equal to or greater than about 1 wt % and equal to or less than about 30 wt % based on a total weight of the graphene derivative.

A weight average molecular weight of the graphene derivative may be about 1000 to about 20000.

The composition may further include a nonionic surfactant.

An amount of the nonionic surfactant may be about 0.01 to about 1 wt % based on a total weight of the composition.

A pattern formation method may include disposing a resist composition on a substrate, to form a resist layer; coating the resist layer with the composition heating the composition to harden the composition; subjecting the resist layer to exposure using extreme ultraviolet light; and developing exposed resist layer with an alkali aqueous solution.

The extreme ultraviolet light may have a wavelength in a range of about 5 to about 20 nm.

The composition may have a thickness of about 1 to about 100 nm on the resist layer.

The heating step may be carried out at a temperature of about 25 to about 150° C.

Embodiments may be realized by providing a pattern formation method, including forming a resist composition on a substrate; coating the resist layer with a topcoat layer; hardening the topcoat layer, the topcoat layer having a transmittance of about 80% or more of ultraviolet light at 13.5 nm; and a transmittance of about 20% or less of ultraviolet light at 193 nm and 248 nm; exposing portions of the resist layer using a mask and ultraviolet light in a wavelength range of about 5 to about 20 nm; and developing the resist layer.

The topcoat layer may have a transmittance of about 85% or more of ultraviolet light at 13.5 nm; and a transmittance of about 15% or less of ultraviolet light at 193 nm and 248 nm.

The resist may be exposed using ultraviolet light having a wavelength of 13.5 nm.

The topcoat layer may include a graphene derivative including a hydrophilic group, and the topcoat layer may be removed using an alkali aqueous solution during development of the resist layer.

The topcoat layer may be removed with an aqueous solvent prior to development of the resist layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

A composition according to an embodiment may be used for forming a topcoat layer on the top surface of a resist layer. The composition contains a graphene derivative, and may form a topcoat layer absorbing light in the wavelength range of 170 to 300 nm, for example, at 193 nm and 248 nm (hereinafter referred to as "deep UV light").

Perfect graphene has a honeycomb-like hexagonal lattice structure. In contrast to carbon nanotubes, graphene is a carbon allotrope in which carbon atoms are mutually bound by $sp^2$ bonds to form a planar (sheet-like) structure. A carbon nanotube has a tube-like structure. Graphene is a compound having a structure in which many aromatic rings are condensed, and may have strong absorption in the deep UV range, for example, at the wavelengths of 193 nm and 248 nm. The absorption of deep UV light may be attributed to the basic structure of the graphene, and graphene derivatives exhibit similar light absorption. Various graphenes with different molecular weight and shape are commercially available. Exemplary graphenes include PureSheets™ MONO and PureSheets™ QUATTRO (manufactured by Nanointegris Co.), XG Leaf™ and XGnp® Graphene Nanosheet (manufactured by XG Science Co.), Graphos Sol-G and Graphos G-Ink (manufactured by Graphos Co.).

Graphene substantially consisting of only carbon atoms without any substituent groups (represented by the following formula) may be very insoluble in organic solvents, water and aqueous solvents, and may be very insoluble in strong alkali aqueous solutions used in a lithographic process, as well.

surface and interaction among the molecules may be enhanced, and film-formability and coverage of the topcoat layer may be improved.

The substituent groups may be hydrophilic groups. Examples include a hydroxyl group, a carboxyl group, an amino group, an amido group, a nitro group, a cyano group, a polyalkyleneoxide group, and a sulfo group. Groups containing elements other than carbon, hydrogen, oxygen and nitrogen may contaminate the reflection mirror of a photo-exposure apparatus during the manufacturing process of semiconductor devices, and should be handled with care. The above substituent groups may improve hydrophilicity of the graphene derivatives, and both solubility to alkali aqueous solutions and film-formability may be improved. Among the hydrophilic groups, the hydroxyl group and the carboxyl group may be introduced easily by oxidizing graphene. Methods to oxidize graphene include, for example, an oxidization reaction using an oxidant may be used. Exemplary oxidants include $KMnO_4$, hypochlorous acid, chloric acid, ammonium persulfate and potassium dichromate. Methods for oxidizing graphene, include, for example, Hummers Method. Hummers Method comprises addition of graphene into a mixture of sulfuric acid, sodium nitrate and $KMnO_4$, to which a large amount of water is added, fol-

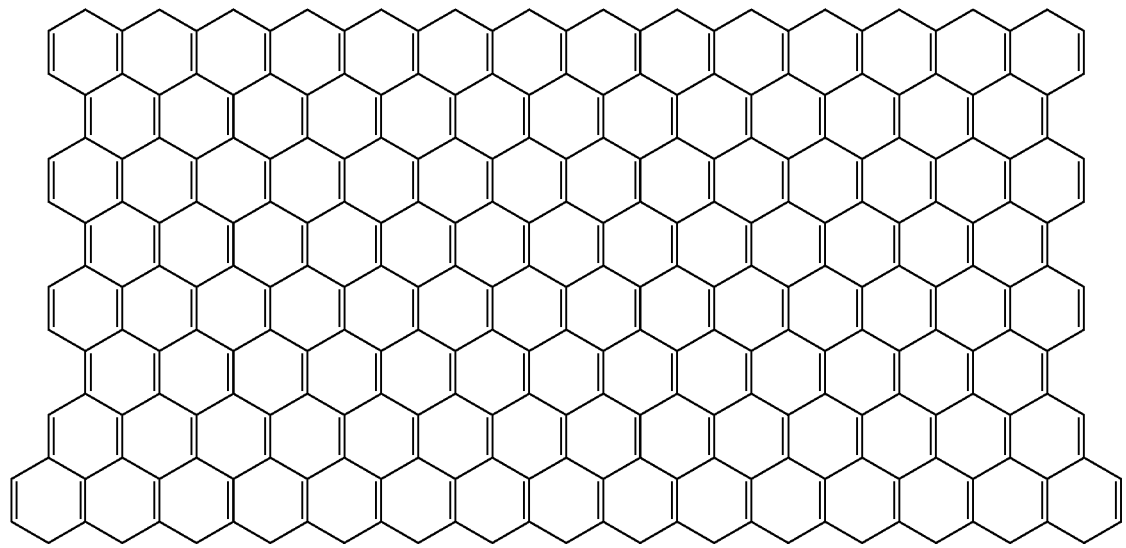

If containing such graphene, the composition for forming a topcoat layer may be difficult to dissolve and remove from the resist surface in the developing procedure. Such graphene may have low polarity and poor affinity to the resist surface, molecules thereof may scarcely interact with each other, and it may be difficult to form a coat covering the resist surface. There may be difficulties associated with adopting graphene consisting of only carbon atoms in the composition for forming a topcoat layer.

A graphene derivative, derived from a graphene by introducing substituent groups into it, may improve the solubility to an alkali aqueous solution. The composition may be easily removed in the developing procedure, affinity to the resist lowed by mildly stirring at a temperature of around 100° C. Reaction time in Hummers Method may be about 0.5-2 hours.

By the oxidization as mentioned above, carbonyl groups or epoxy groups other than hydroxyl groups and carboxyl group may be introduced into a graphene derivative. Carbonyl group and epoxy group absorption of extreme UV light may be small, and carbonyl groups and epoxy groups may have no undesirable influence on the sensitivity of a resist. Hydroxyl groups and carboxyl groups have weak acidity, and may exhibit an effect to facilitate the sensitivity of a resist. The following formula shows an example of the structure of a graphene derivative obtained by oxidizing graphene.

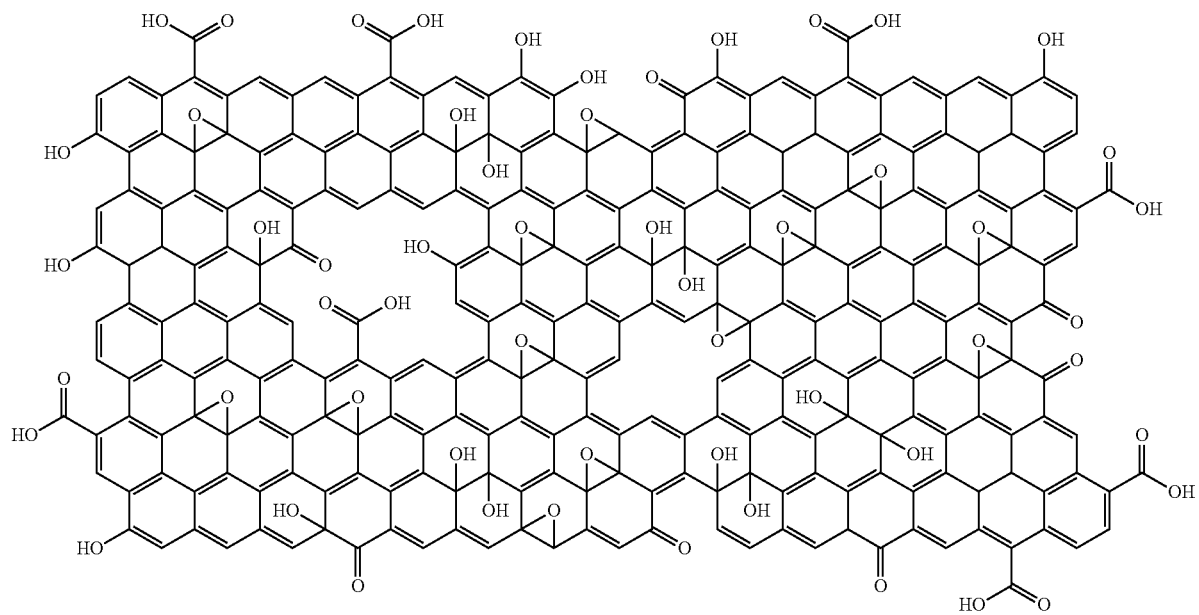

The graphene derivative may contain a large number of hydrophilic groups. The number of hydrophilic groups contained in a graphene derivative may be determined, for example, by neutralization determination. Such determination may be difficult if the water-solubility of a graphene derivative is low. The hydrophilicity of a graphene derivative may be evaluated by determining the oxygen content of the graphene derivative. Carboxyl groups and hydroxyl groups are introduced by an oxidization reaction, and the number of carboxyl groups and hydroxyl groups contained in a graphene derivative may be assumed to be proportional to the oxygen content of the graphene derivative.

According to the present example embodiment, the oxygen content of a graphene derivative may be equal to or greater than about 1 wt %, for example, equal to or greater than about 3 wt %, or equal to or greater than about 5 wt %. Maintaining oxygen content within this range may help provide sufficient solubility to an alkali developer, e.g., a 2.38% aqueous tetramethyl ammonium hydroxide (TMAH) solution, which may be used in a resist pattern formation process.

According to the present example embodiment, oxygen content may be equal to or less than about 30 wt %, for example, equal to or less than about 15 wt %, or equal to or less than about 10 wt %. If oxygen content is excessively high, the graphene skeleton may be damaged to a large extent by an oxidization reaction, which may lead to reduction in extreme UV light transmission effect. The oxygen content of a graphene derivative may be determined by Energy Dispersion X-ray Spectroscopy (EDS) or Wavelength Dispersion X-ray Analysis (WDS).

The weight average molecular weight of the above graphene derivative may be, for example, about 1000 to about 20000, or about 2000 to about 5000, and the composition for forming a topcoat layer may have favorable coatability.

Various kinds of graphene derivatives and graphene oxides as mentioned above are commercially available. Examples include TimesGraph™ (manufactured by of TimesNano Co.), G-Gosi and Sol-GoGo (manufactured by Graphos Co.), Rap Go and Rap b Go (manufactured by NiSiNa Materials Co.).

The content of the graphene derivative in the composition for forming a topcoat layer may be controlled according to the optical and gas-barrier characteristics desired of the topcoat layer, and may be about 0.01 to about 10 wt %, for example, about 0.5 to about 5 wt %, based on the total weight of the composition. The graphene derivative may function as a film-forming component by itself, rather than as an additive used in combination with a film-forming polymer for the topcoat layer, and in the composition for forming a topcoat layer, all the solid contents may be attributed to the graphene derivative.

The composition for forming a topcoat layer according to an embodiment contains a solvent, which may uniformly dissolve or disperse the above graphene derivative and, may include, polymers and additives. Examples of the solvent include:

mono-alcohols, such as, methyl alcohol, ethyl alcohol, isopropyl alcohol, and methyl isobutyl carbinol;

polyols, such as, ethylene glycol and glycerol;

alkyl ethers of polyols, such as, ethylene glycol monomethyl ether, ethylene glycol monoethyl ether and propylene glycol monomethyl ether;

alkyl ether acetates of polyols, such as, ethylene glycol monomethyl ether acetate and ethylene glycol monoethyl ether acetate;

ethers, such as, diethyl ether and dibutyl ether;

cyclic ethers, such as, tetrahydrofuran;

hydrocarbons having 12 or less carbon atoms, such as, n-hexane, n-octane, and cyclohexane;

aromatic hydrocarbons, such as, benzene and toluene;

ketones, such as, acetone and methyl ethyl ketone;

esters, such as, methyl acetate, ethyl acetate, and ethyl lactate; and water (for example, that may have low solvency to resist patterns).

Some organic solvents highly dissolve resist patterns. If such solvents are used, such solvents may be mixed with solvents having low solvency to resist patterns, for example, with water.

The composition for forming a topcoat layer may comprise only the graphene derivative and the solvent. The composition may further contain a polymer as a film-forming component. Hereinafter, such polymer is referred to as "binder polymer" or simply "binder". The graphene derivative has a hydrophilic group, and the composition for forming a topcoat layer according to an embodiment may be characterized by being capable of forming a film even if the composition does not contain a binder as a film-forming component. The composition containing no binder may be used to form a topcoat layer, and the formed topcoat layer may be easily removed by a developer. The composition may not contain a binder as a film-forming component, and the composition may form a topcoat layer. The substituent groups introduced into the graphene derivative may be chemically adsorbed onto the resist surface and may also make molecules of the graphene derivative interact to combine with each other.

The binder may be incorporated as a film-forming component into the composition, and the film-formability may be improved to form a more even topcoat layer. If containing the binder, the composition may form a relatively strong topcoat layer, and may prevent the topcoat layer from exfoliation that may be caused by, for example, physical contact.

If used in combination with the graphene derivative, the binder may have high compatibility with the derivative. The binder may be a natural polymer compound. A synthetic co-polymer or homo-polymer comprising repeating units may have production stability. The binder polymer may be formed by a suitable polymerization reaction, such as, condensation polymerization, ring-opening polymerization, or addition polymerization.

Examples of suitable binders include: phenolic resins such as novolac resin, poly-hydroxy-styrene, poly-carboxy-styrene, polyvinyl alcohol, polyacrylic acid, poly-methacrylic acid, polyacrylic esters, polymethacrylic esters, polyvinyl acetate, polyvinyl-pyrrolidone and polyvinyl imidazole. Such polymers are selected in accordance with the purpose. The polymer may contain neither acidic groups nor basic groups. For a polymer containing an acidic group, the solubility of the graphene derivative may be lowered. For a polymer containing a basic group, the polymer and the graphene derivative may condense. Exemplary binders include alcohol, phenolic resins, and polyvinyl-pyrrolidone.

The binder may comprise a hydrophilic group, and the binder may be soluble in water. Examples of such a hydrophilic group include a hydroxyl group, a carboxyl group, a sulfo group, a substituted or unsubstituted amino group, a substituted or unsubstituted ammonium group, a carboxylic ester group, a sulfonic ester group, a substituted or unsubstituted amido group, an alkyleneoxide group, and an oxime group. The above groups may have substituent groups, examples of which include aliphatic hydrocarbon groups such as alkyl groups and aromatic hydrocarbon groups such as phenyl groups. The substituent groups may be aromatic hydrocarbon groups, and may serve as deep-UV absorbing groups. The topcoat layer may be used in a pattern formation process in which development may be carried out with, for example, an alkali aqueous solution. For a graphene derivative having less hydrophilic groups, the pattern formation process may include development with an organic solvent.

The composition may contain the binder, and the content thereof may be controlled according to, for example, the desired thickness, and may be about 0.01 to about 10 wt %, for example, about 0.5 to about 5 wt %, based on the total weight of the composition for forming a topcoat layer. If the composition contains a large amount of binder, the resultant topcoat layer may be thick and may absorb a large amount of extreme UV light.

The binder may have deep-UV absorbing groups that may assist the graphene derivative in absorbing deep UV light. The term "deep-UV absorbing groups" herein means groups that absorb light in the wavelength range of about 170 to about 300 nm. Examples thereof include aromatic groups, for example, phenyl, naphthyl and anthracenyl. Such groups may have substituent groups. Examples of the substituent groups include hydrocarbon groups such as alkyl groups.

The above binders may be used alone or in combination of equal to or more than two kinds thereof in accordance with the strength of the layer formed, compatibility with the graphene derivative, solubility to water and deep UV light absorption effect.

The composition for forming a topcoat layer may further contain other additives, which may, for example, enhance coatability of the composition onto the resist layer and improve characteristics of the formed topcoat layer. The additives are, for example, surfactants. Examples of the surfactants include:

anionic surfactants, such as, alkyl diphenyl ether disulfonic acid, alkyl diphenyl ether sulfonic acid, alkyl benzene sulfonic acid, polyoxyethylene alkyl ether sulfuric acid, alkyl sulfuric acid, and ammonium salts and organic amine salts thereof;

cationic surfactants, such as, hexadecyl trimethyl ammonium hydroxide;

nonionic surfactants, such as, polyoxyethylene alkyl ethers (for example, polyoxyethylene lauryl ether, polyoxyethylene oleyl ether, and polyoxyethylene cetyl ether), polyoxyethylene fatty acid diester, polyoxyethylene fatty acid monoester, polyoxyethylene-polyoxypropylene block copolymer, and acetylene glycol derivatives; and amphoteric surfactants, such as, 2-alkyl-N-carboxymethyl-N-hydroxyethyl imidazolinium betaine, lauric acid amide propyl hydroxyl sulfone betaine.

The amine groups or carboxyl groups in surfactants may react with the hydrophilic groups connected to the graphene derivative. Other additives are, for example, thickening agents, colorants such as dyes, acids and bases. The amount of each additive may be determined in consideration of the effect thereof, and may be about 0.01 to about 1 wt %, for example, about 0.1 to about 0.5 wt % based on the total weight of the composition.

The composition for foaming a topcoat layer according to an embodiment may further contain a basic compound, which may help enhance the solubility of the graphene derivative. Examples of such basic compounds include ammonia, monoethanol amine, TMAH, and sodium hydroxide. A polymer having a basic group in its side chains may be used, but attention should be paid to the avoidance of such polymer condensing with the graphene derivative, whereby it may not dissolve or disperse in the solvent.

The composition for forming a topcoat layer according to an embodiment may be used in the same manner as a composition for forming a topcoat layer or for forming a top antireflective coating. It may be unnecessary to change the production process drastically when patterns are formed by use of the composition according to an embodiment. The following describes the pattern formation method employing the composition for forming a topcoat layer according to an embodiment.

First, a resist composition is cast on the surface, which may be pretreated, of a substrate such as a silicon substrate or a glass substrate according to a coating method such as spin-coating method, to form a resist composition layer. Prior to the coating of the resist composition, an undercoating layer may be beforehand formed under the resist composition layer by coating. The undercoating layer may improve adhesion between the resist layer and the substrate. If containing transition metals or oxides, the undercoating layer may enhance reflected light, and the exposure margin may be improved.

The pattern formation method according to an embodiment may employ a resist composition sensitive to extreme UV light. A resist composition for deep UV exposure, such as, a photoresist composition for ArF or KrF laser exposure may be used. In the pattern formation method according to an embodiment, a suitable resist composition that has sensitivity to extreme UV light may be used, for example, positive- and negative-working chemically amplified resist compositions.

Either positive- or negative-working chemically amplified resist composition may be used in the pattern formation method according to an embodiment. The chemically amplified resist composition may generate an acid when exposed to radiation, and the acid may serve as a catalyst to promote chemical reaction by which solubility to a developer may be changed within the areas irradiated with the radiation to form a pattern. For example, the chemically amplified resist composition may comprise an acid-generating compound, which may generate an acid when exposed to radiation, and an acid-sensitive functional group-containing resin, which may decompose in the presence of acid to form an alkali-soluble group such as phenolic hydroxyl or carboxyl group. The composition may comprise an alkali-soluble resin, a crosslinking agent and an acid-generating compound.

Subsequently, according to, for example, spin-coating, the resist layer formed on the substrate may be coated with the composition for forming a topcoat layer according to an embodiment. The applied composition may then be heated to evaporate the solvent, and form a topcoat layer. The heating may be carried out using, for example, a hot-plate. The temperature of heating may be determined according to the solvent of the composition, and may be about 25 to about 150° C., for example, about 80 to about 130° C., or about 90 to about 110° C. The formed topcoat layer may have a thickness of about 1 to about 100 nm, for example, about 5 to about 50 nm.

The resist layer may be heated alone to harden immediately after being formed on the substrate, and then the composition for forming a topcoat layer may be cast thereon and heated.

The formed topcoat layer may be highly transparent to extreme UV light. Transparency to extreme UV light hardly may depend on the substituent groups of the polymer, and may depend on the kinds of elements constituting the polymer. Carbon and hydrogen, which are main constituting elements of the topcoat layer, may absorb extreme UV light to such a small degree that the topcoat layer may be largely transparent to extreme UV light. The topcoat layer may have transmittance of about 80% or more, for example, about 85% or more, of extreme UV light at 13.5 nm. The topcoat layer formed in the above manner may absorb deep UV light, and may have transmittance of about 20% or less, for example, about 15% or less, of deep UV light at 193 nm and 248 nm.

Thereafter, the resist layer may be subjected to exposure through a mask using extreme UV light, for example, in the wavelength range of about 5 to about 20 nm, for example, at 13.5 nm.

After the exposure, the resist layer may be subjected to after-exposure heating, if necessary, and then developed in the manner of, for example, paddle development, to form a resist pattern. The development may be carried out by use of an alkali developer. The graphene derivative contained in the composition for forming a topcoat layer according to an embodiment may have a hydrophilic group, which may help removal of the topcoat layer by the developer.

Both removal of the topcoat layer and development of the resist layer may be conducted with an alkali developer at the same time without exceptional procedures. In another implementation, the topcoat layer may be alone removed with an aqueous solvent such as water, and then the resist layer may be independently developed with an alkali developer.

Examples of the alkali developer include aqueous solutions of sodium hydroxide and TMAH. After the development, the resist pattern may be rinsed (washed) with a rinse solution, for example, pure water. The formed resist pattern may be employed as a resist for etching, plating, ion diffusion or dyeing, and may then be peeled away.

The thickness of the resist pattern may be suitably determined according to, for example, the use, and may be about 0.1 to about 150 nm, for example, about 20 to about 80 nm.

The formed resist pattern by the pattern formation method according to an embodiment may then be fabricated.

If graphene derivative is added into the resist composition, deep-UV light may be absorbed to some degree. However, the graphene derivative is left in the resultant resist layer, and when the pattern is formed, the graphene derivative remains on the top and side surfaces of the resist pattern. Graphene derivatives may be harder than the hardened resist layer, the remaining graphene derivative may form convex bumps on the top and side surfaces of the resist pattern, and the bumps may come off to form defects in the shape of craters on the surfaces. It is unfavorable for the resist pattern surface to have convex bumps and/or concave defects since they may cause deterioration in roughness. According to embodiments, graphene derivative is not contained in the resist layer and removed in the developing procedure, and defects in the resist pattern surface may be avoided.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 101 to 116

As the graphene derivative, a commercially available graphene TimesGraph™ (manufactured by TimesNano Co.) was used in the following examples.

Polymers used as the binders were as follows:

P1: polyvinyl alcohol (weight average molecular weight: 22000);

P2: novolac resin (weight average molecular weight: 8500);

P3: poly-carboxy-styrene;

P4: polyvinyl pyrrolidone (weight average molecular weight: 12000); and

P5: polyvinyl imidazole (weight average molecular weight: 45000).

The above graphene derivative and binders were dissolved in water as solvent in such amounts that the solid contents were 2 wt % to prepare each composition for forming a topcoat layer. The obtained compositions were observed by the eye to evaluate the solubility, and thereby graded according to the following criteria:

A: the composition was transparent, and hence the solid contents were evaluated to be dissolved or dispersed completely;

B: the composition was slightly clouded but almost transparent, and hence the solid contents were evaluated to be dissolved or dispersed sufficiently;

C: there were some residue in the composition, and hence the solid contents were evaluated to be slightly poor in solubility but practically usable; and D: there were much residue in the composition, and hence the composition was evaluated to be practically unusable.

Independently, a substrate was spin-coated with a resist composition in a thickness of 50 nm. The resist composition was AZ® AX2110 (manufactured by AZ Electronic Materials (Japan) K.K.). After the resist composition was cast on the substrate, each composition for forming a topcoat layer was cast thereon by spin-coating in a thickness of 30 nm. The layered compositions were then heated at 120° C. for 60 seconds to obtain a resist layer covered with a topcoat layer. The formed topcoat layer was observed by the eye and the thickness thereof was measured with a thickness meter to evaluate the coatability of each composition for forming a topcoat layer and thereby to grade them according to the following criteria:

A: the composition was coatable, and the formed topcoat layer was evaluated to be excellent in in-plane evenness of the thickness;

B: the composition was coatable, and the formed topcoat layer was evaluated to be slightly poor in in-plane evenness but sufficiently usable in practice;

C: the composition was coatable, and the formed topcoat layer was evaluated to be poor in surface shape but usable in practice; and D: the composition was uncoatable.

The resist layer thus formed was developed for 30 seconds with a 2.38 wt % TMAH aqueous solution, and then residue left on the surface were evaluated. The results are shown in Table 1.

TABLE 1

| Examples | Contents (wt %) | | | | | | Solubility | Coatability Effect | Residue on Surface |
|---|---|---|---|---|---|---|---|---|---|
| | Grahene oxide | P1 | P2 | P3 | P4 | P5 | | | |
| Ex. 101 | 100 | | | | | | A | C | None |
| Ex. 102 | 50 | 50 | | | | | A | B | None |
| Ex. 103 | 30 | 70 | | | | | A | B | None |
| Ex. 104 | 10 | 90 | | | | | A | A | None |
| Ex. 105 | 50 | | 50 | | | | A | C | None |
| Ex. 106 | 30 | | 70 | | | | A | C | None |
| Ex. 107 | 10 | | 90 | | | | A | B | None |
| Ex. 108 | 50 | | | 50 | | | C | — | — |
| Ex. 109 | 30 | | | 70 | | | C | — | — |
| Ex. 110 | 10 | | | 90 | | | C | — | — |
| Ex. 111 | 50 | | | | 50 | | A | C | None |
| Ex. 112 | 30 | | | | 70 | | A | C | None |
| Ex. 113 | 10 | | | | 90 | | A | C | None |
| Ex. 114 | 50 | | | | | 50 | C | — | — |
| Ex. 115 | 30 | | | | | 70 | C | — | — |
| Ex. 116 | 10 | | | | | 90 | C | — | — |

Comparative Example 201 and Examples 201 to 209

The procedure of Example 101 was repeated except that the composition for forming a topcoat layer was changed into each of the compositions shown in Table 2, to form a resist layer. Each resist layer was subjected to exposure by use of a BL03 beam from SPring-8 at the illuminance of 0.35 mW/cm$^2$, and then developed for 30 seconds with a 2.38 wt % aqueous solution of TMAH. In that way, the exposure amount necessary for forming a pattern (i.e., the energy threshold) $E_{th}$ was measured. The lower the energy threshold $E_{th}$ is, the higher the sensitivity is. It was not deemed to impede practicality if the difference was equal to or less than 2 mJ/cm$^2$ and, hence, it was determined that Examples 201-209 exhibited sufficient sensitivity.

TABLE 2

| Examples | Contents (wt %) | | | | Energy Threshold $E_{th}$ (mJ/cm$^2$) |
|---|---|---|---|---|---|
| | Graphene oxide | P1 | P2 | P4 | |
| Comparative Ex. 201 | No Binder | | | | 5.5 |
| Ex. 201 | 50 | 50 | | | 6.6 |
| Ex. 202 | 30 | 70 | | | 6.9 |
| Ex. 203 | 10 | 90 | | | 7.1 |
| Ex. 204 | 50 | | 50 | | 4.5 |
| Ex. 205 | 30 | | 70 | | 4.7 |
| Ex. 206 | 10 | | 90 | | 5.1 |
| Ex. 207 | 50 | | | 50 | 5.6 |
| Ex. 208 | 30 | | | 70 | 5.7 |
| Ex. 209 | 10 | | | 90 | 5.7 |

Examples 301 to 309

The composition for forming a topcoat layer was cast by spin-coating to form a layer of 30 nm thickness, and then the light-transmittance of the layer was evaluated. Specifically, the absorption coefficient was estimated by analysis with a spectroscopic ellipsometer, to calculate k values at the wavelengths of 193 nm and 248 nm. The results are shown in Table 3. It was found that if k values at the wavelengths of 193 nm and 248 nm are equal to or larger than 0.5 and equal to or larger than 0.3, respectively, the topcoat layers have sufficient deep UV light absorption effect. Therefore, it was found that deep UV light absorption was sufficiently large in Examples 301-309.

TABLE 3

| Examples | Contents (wt %) | | | | K Value | |
|---|---|---|---|---|---|---|
| | Graphene oxide | P1 | P2 | P4 | 193 nm | 248 nm |
| Ex. 301 | 50 | 50 | | | 0.83 | 0.47 |
| Ex. 302 | 30 | 70 | | | 0.71 | 0.38 |
| Ex. 303 | 10 | 90 | | | 0.52 | 0.33 |
| Ex. 304 | 50 | | 50 | | 0.91 | 0.68 |
| Ex. 305 | 30 | | 70 | | 0.85 | 0.58 |
| Ex. 306 | 10 | | 90 | | 0.64 | 0.46 |
| Ex. 307 | 50 | | | 50 | 0.78 | 0.42 |
| Ex. 308 | 30 | | | 70 | 0.63 | 0.35 |
| Ex. 309 | 10 | | | 90 | 0.57 | 0.32 |

Comparative Example 401 and Examples 401 to 409

A substrate was spin-coated with a resist composition in a thickness of 50 nm. The resist composition was AZ® AX2110 (manufactured by AZ Electronic Materials (Japan) K.K.). After the resist composition was cast on the substrate, the resist was heated at 120° C. for 60 seconds to form a resist layer. Thickness of each of the resist layer thus formed was measured.

Further, each of the compositions for forming a topcoat layer as shown in Table 4 was cast thereon by spin-coating in a thickness of 30 nm. The layered compositions were then heated at 120° C. for 60 seconds to obtain a resist layer covered with a topcoat layer. The resist layer thus obtained was subject to development with a 2.38 wt % TMAH aqueous solution to remove the topcoat layer. Thereafter, thickness of the layer left was measured.

The above measurement was repeated twice to thereby evaluate the loss of thickness caused by development. The results are shown in Table 4.

TABLE 4

| | Contents (wt %) | | | | Loss of |
| | Graphene | Binder | | | Thickness |
| Examples | oxide | P1 | P2 | P4 | (nm) |
|---|---|---|---|---|---|
| Comparative Ex. 401 | | No Binder | | | −1.6 |
| Ex. 401 | 50 | 50 | | | −2.1 |
| Ex. 402 | 30 | 70 | | | −2.3 |
| Ex. 403 | 10 | 90 | | | −2.2 |
| Ex. 404 | 50 | | 50 | | −1.5 |
| Ex. 405 | 30 | | 70 | | −1.8 |
| Ex. 406 | 10 | | 90 | | −1.7 |
| Ex. 407 | 50 | | | 50 | −2.0 |
| Ex. 408 | 30 | | | 70 | −1.9 |
| Ex. 409 | 10 | | | 90 | −2.2 |

Although loss of thickness was somewhat higher in examples with a topcoat layer than in the example without a topcoat layer, such loss is not deemed to impede practicality.

By way of summation and review, resist compositions sensitive to light in various wavelength ranges have been developed. Commercially available chemically amplified resist compositions have been considered for use in a photo-lithographic process with extreme UV light. For example, resist compositions for KrF or ArF laser exposure have been considered for use in a lithographic process including exposure to extreme UV light. However, resolution, sensitivity, and roughness such as line width roughness (LWR) and line edge roughness (LER) may merit attention.

Further, light sources and masks in exposure apparatuses may merit attention. As such, lithography techniques with extreme UV light have not yet been widely employed in practice. It has been thought that resist pattern shapes are impaired by longer wavelength light, for example, deep UV light of, for example, 193 nm or 248 nm, contained in emission from extreme UV light sources. When resist compositions for KrF or ArF laser exposure are used as described above in a lithographic process with extreme UV light, they are made to sensitively react not only to extreme UV light, but also to deep UV light in a longer wavelength range than extreme UV light.

Extreme UV light sources may emit extreme UV light together with longer wavelength light, such as deep UV light. A fine pattern may be intended to be formed according to a lithographic process by use of extreme UV light, and a light source emitting less of such deep UV light may be used. The method of generating extreme UV light may be controlled, and deep UV light may be removed from radiation emitted by exposure apparatuses. For example, optical systems in the apparatuses may be regulated so as to remove deep UV light from emission of light sources. It may be difficult to remove deep UV light completely from emission of conventional light sources, e.g., to reduce the ratio of deep UV light down to 3% or less in exposure light. Deep UV light contained in emission from extreme UV light sources may cause impairment of resist patterns in view of roughness and pattern shape.

The top surface of a resist layer may be coated with a topcoat layer that transmits extreme UV light and absorbs deep UV light. Consideration has been given to polymers that may absorb deep UV light enough to be usable for the topcoat layer. The polymers may include benzene, naphthalene or anthracene skeletons.

Provided is a composition for forming a topcoat layer containing a graphene derivative having a hydrophilic group, and a solvent, the topcoat layer absorbing deep UV light. The topcoat layer may reduce unfavorable effects of deep UV light, may help protect a resist pattern from impairment in roughness and in pattern shape, and may help prevent a resist layer from releasing gases in a photolithographic process for pattern formation including exposure to extreme UV light. The composition may be provided on a resist layer before the resist layer is exposed to extreme UV light for producing a resist pattern in a photolithographic process. The topcoat layer may achieve a greater deep UV light absorbance. A minute pattern may be produced accurately. The composition for forming a topcoat layer may reduce residue remaining after development on the surface of a resist pattern and may contribute to excellent pattern formation. Also provided is a pattern formation method using the composition for forming a topcoat layer.

Example embodiments has been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming a topcoat layer, the composition comprising:
   a graphene derivative including a hydrophilic group;
   a solvent; and
   a binder including a deep-ultraviolet absorbing group, wherein:
   the graphene derivative is present in an amount of about 0.5 to about 10 wt % based on a total weight of the composition,
   the binder is present in an amount about 0.01 to about 10 wt % based on a total weight of the composition,
   the graphene derivative and the binder are present in a weight ratio of about 30:70 to about 50:50 in the composition, and an oxygen content of the graphene derivative is equal to or greater than about 1 wt % and equal to or less than about 10 wt % based on a total weight of the graphene derivative.

2. The composition as claimed in claim 1, wherein the hydrophilic group is selected from a hydroxyl group, a carboxyl group, an amino group, an amido group, a nitro group, a cyano group, a polyalkyleneoxide group, and a sulfo group.

3. The composition as claimed in claim 1, wherein the graphene derivative is obtained by oxidizing graphene.

4. The composition as claimed in claim 1, wherein a weight average molecular weight of the graphene derivative is about 1000 to about 20000.

5. A composition for forming a topcoat layer, the composition comprising:
 a nonionic surfactant;
 a graphene derivative including a hydrophilic group;
 a solvent; and
 a binder including a deep-ultraviolet absorbing group, wherein:
 the graphene derivative is present in an amount of about 0.5 to about 10 wt % based on a total weight of the composition,
 the binder is present in an amount about 0.01 to about 10 wt % based on a total weight of the composition, and
 an oxygen content of the graphene derivative is equal to or greater than about 1 wt % and equal to or less than about 10 wt % based on a total weight of the graphene derivative.

6. The composition as claimed in claim 5, wherein an amount of the nonionic surfactant is about 0.01 to about 0.5 wt % based on a total weight of the composition.

7. A pattern formation method, comprising:
 disposing a resist composition on a substrate, to form a resist layer;
 coating the resist layer with a topcoat composition for forming a topcoat layer, the topcoat composition including:
  a graphene derivative including a hydrophilic group; and
  a solvent;
 heating the topcoat composition to harden the topcoat composition;
 subjecting the resist layer to exposure using extreme ultraviolet light; and
 developing exposed resist layer with an alkali aqueous solution.

8. The pattern formation method as claimed in claim 7, wherein the extreme ultraviolet light has a wavelength in a range of about 5 to about 20 nm.

9. The pattern formation method as claimed in claim 8, wherein the topcoat composition has a thickness of about 1 to about 100 nm on the resist layer.

10. The pattern formation method as claimed in claim 7, wherein the heating step is carried out at a temperature of about 25 to about 150° C.

* * * * *